United States Patent
Lee et al.

(10) Patent No.: US 9,378,950 B1
(45) Date of Patent: Jun. 28, 2016

(54) METHODS FOR REMOVING NUCLEI FORMED DURING EPITAXIAL GROWTH

(71) Applicants: Stratio, Inc., San Jose, CA (US); Stratio, Seoul (KR)

(72) Inventors: Jae Hyung Lee, Palo Alto, CA (US); Youngsik Kim, Palo Alto, CA (US); Yeul Na, East Palo Alto, CA (US); Woo-Shik Jung, San Jose, CA (US)

(73) Assignees: STRATIO, Seoul (KR); STRATIO INC., San Jose, CA (US)

( * ) Notice: Subject to any disclaimer, the term of this patent is extended or adjusted under 35 U.S.C. 154(b) by 0 days.

(21) Appl. No.: 15/051,362

(22) Filed: Feb. 23, 2016

Related U.S. Application Data

(60) Provisional application No. 62/165,816, filed on May 22, 2015.

(51) Int. Cl.
  *H01L 21/336* (2006.01)
  *H01L 21/02* (2006.01)
  *H01L 21/308* (2006.01)

(52) U.S. Cl.
  CPC .... *H01L 21/02639* (2013.01); *H01L 21/02532* (2013.01); *H01L 21/3081* (2013.01)

(58) Field of Classification Search
  CPC .......... H01L 21/02104; H01L 21/02293; H01L 21/02667; H01L 21/02636; H01L 21/20; H01L 21/2018
  See application file for complete search history.

(56) References Cited

U.S. PATENT DOCUMENTS

2013/0255567 A1* 10/2013 Wei .............. H01L 21/0237
  117/106

* cited by examiner

*Primary Examiner* — Hoai V Pham
(74) *Attorney, Agent, or Firm* — Morgan, Lewis & Bockius LLP

(57) ABSTRACT

A method for removing nuclei formed during a selective epitaxial growth process includes epitaxially growing a first group of one or more semiconductor structures over a substrate with one or more mask layers. A second group of a plurality of semiconductor structures is formed on the one or more mask layers. The method also includes forming one or more protective layers over the first group of one or more semiconductor structures. At least a subset of the second group of the plurality of semiconductor structures is exposed from the one or more protective layers. The method further includes, subsequent to forming the one or more protective layers over the first group of one or more semiconductor structures, etching at least the subset of the second group of the plurality of semiconductor structures.

30 Claims, 15 Drawing Sheets

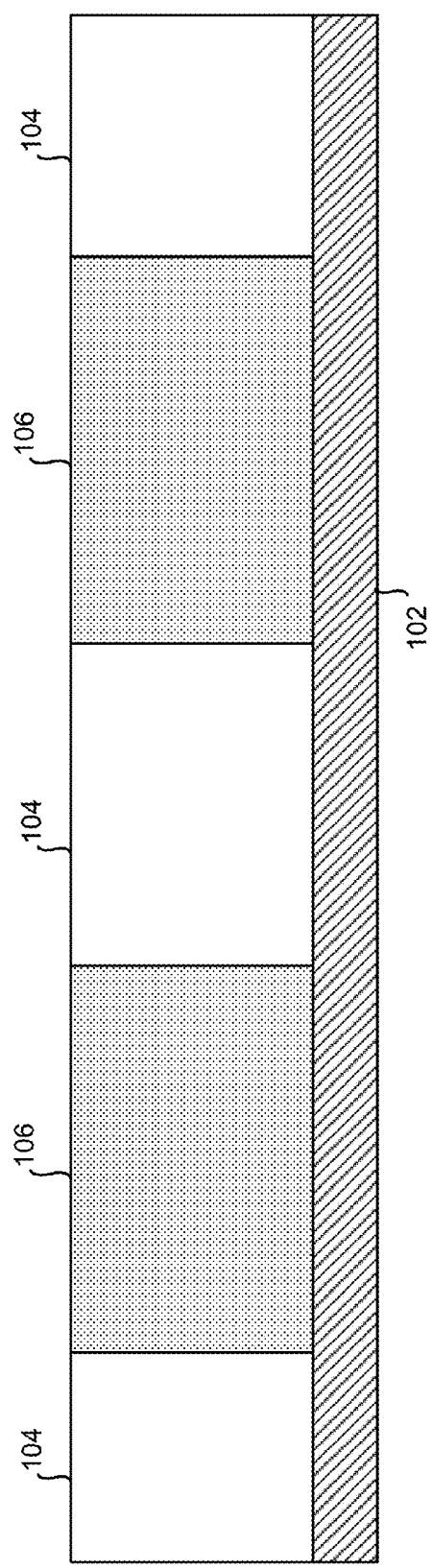

700

702 Epitaxially grow a first group of one or more semiconductor structures on a substrate with one or more mask layers. A second group of a plurality of semiconductor structures is formed on the one or more mask layers.

704 The first group of the one or more semiconductor structures is formed in a single epitaxial growth process 706 Form a plurality of semiconductor particles on the one or more mask layers while epitaxially growing the first group of one or more semiconductor structures on the substrate with one or more mask layers 708 The second group of the plurality of semiconductor structures includes a semiconductor film on the one or more mask layers 710 The first group of one or more semiconductor structures includes a column IV material 712 The first group of one or more semiconductor structures includes germanium 714 The first group of one or more semiconductor structures is formed on one or more regions of the substrate that are exposed from the one or more mask layers 716 The first group of one or more semiconductor structures has crystalline structures and the second group of the plurality of semiconductor structures has amorphous and/or poly-crystalline structures 718 The one or more mask layers include a dielectric material 720 The one or more mask layers include silicon dioxide

Figure 7A

722 Form one or more protective layers over the first group of one or more semiconductor structures. At least a subset of the second group of the plurality of semiconductor structures is exposed from the one or more protective layers.

724 Forego etching at least the subset of the plurality of semiconductor structures before the one or more protective layers are formed over the one or more semiconductor structures 726 Forego etching at least the subset of the plurality of semiconductor structures subsequent to initiating the epitaxial growth of the first group of one or more semiconductor structures on the substrate 728 The one or more protective layers include one or more photoresist layers 730 Deposit one or more adhesive layers over at least the first group of one or more semiconductor structures prior to forming the one or more protective layers 732 The one or more adhesive layers include hexamethyldisilazane and/or low-temperature thermal oxide 734 The substrate includes a plurality of semiconductor devices thereon 736 The plurality of semiconductor devices is located on the substrate below the one or more mask layers 738 The substrate includes a plurality of complementary metal-oxide semiconductor (CMOS) devices thereon

Figure 7B

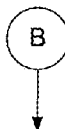

740 Subsequent to forming the one or more protective layers over the first group of one or more semiconductor structures, etch at least the subset of the second group of the plurality of semiconductor structures 742 Subsequent to etching at least the subset of the second group of the plurality of semiconductor structures: remove the one or more protective layers; and/or planarize at least a subset of the first group of one or more semiconductor structures.

744 Etching at least the subset of the second group of the plurality of semiconductor structures includes etching at least the subset of the second group of the plurality of semiconductor structures at a first rate and etching the one or more mask layers at a second rate that is lower than the first rate

Figure 7C

METHODS FOR REMOVING NUCLEI FORMED DURING EPITAXIAL GROWTH

RELATED APPLICATION

This application claims the benefit of, and priority to, U.S. Provisional Patent Application Ser. No. 62/165,816, filed May 22, 2015, entitled "Methods for Removing Nuclei Formed during Epitaxial Growth," which is incorporated by reference herein in its entirety.

TECHNICAL FIELD

This application relates generally to methods for manufacturing semiconductor devices. More particularly, the disclosed embodiments relate to methods for removing nuclei formed on semiconductor devices during epitaxial growth processes.

BACKGROUND

Epitaxial growth is a popular method of creating a crystalline region on a semiconductor substrate. However, formation of semiconductor structures in unwanted regions of the semiconductor substrate is undesirable. For example, any semiconductor structures grown in unwanted regions of the semiconductor substrate can adversely affect the electrical and/or mechanical properties of a device formed on the substrate.

Selective epitaxial growth (SEG) is used for creating a crystalline region on targeted areas of the semiconductor substrate. For a selective epitaxial growth, a semiconductor substrate is covered with a masking material, exposing certain areas of the underlying substrate. For such semiconductor substrate, the epitaxial growth occurs mainly on the exposed areas of the semiconductor substrate, and less so on the masking material. Although the selective epitaxial growth may reduce formation of structures (e.g., in the form of nuclei or layers) on the masking material during the epitaxial growth, depending on the process conditions, many semiconductor structures may still form on the masking material during the epitaxial growth.

Various attempts have been made to eliminate the formation of the epitaxially grown structures on the masking material. For example, certain growth conditions have been found to further suppress the formation of the epitaxially grown structures on the masking material. However, a small deviation from the prescribed growth conditions can easily lead to an increased formation of epitaxially grown structures on the masking material. Thus, the use of such growth conditions is limited.

SUMMARY

Thus, there is a need for improved methods of removing nuclei formed during epitaxial growth. In some embodiments, the methods would be less-sensitive to changes to the growth conditions. Thus, such improved methods would also enable faster epitaxial growth of semiconductor structures while reducing the formation of semiconductor structures on unwanted regions of the substrate during the epitaxial growth.

A number of embodiments that overcome the limitations and disadvantages described above are presented in more detail below. These embodiments provide devices and methods for making such devices.

As described in more detail below, some embodiments involve a method for removing nuclei formed during a selective epitaxial growth process that includes epitaxially growing a first group of one or more semiconductor structures on a substrate with one or more mask layers. A second group of a plurality of semiconductor structures is formed on the one or more mask layers. The method also includes forming one or more protective layers over the first group of one or more semiconductor structures. At least a subset of the second group of the plurality of semiconductor structures is exposed from the one or more protective layers. The method further includes, subsequent to forming the one or more protective layers over the first group of one or more semiconductor structures, etching at least the subset of the second group of the plurality of semiconductor structures.

In accordance with some embodiments, a semiconductor device includes a substrate; a first mask layer region that is located over the substrate; and a second mask layer region that is located over the substrate. The first mask layer region has a top surface and a lateral surface, and the second mask layer region has a top surface and a lateral surface. The semiconductor device also includes an epitaxially grown semiconductor structure of a first semiconductor material type. The epitaxially grown semiconductor structure is located between the lateral surface of the first mask layer region and the lateral surface of the second mask layer region, and the epitaxially grown semiconductor structure is in contact with the lateral surface of the first mask layer region and the lateral surface of the second mask layer region. The top surface of the first mask layer region and the top surface of the second mask layer region are not in contact with a semiconductor of the first semiconductor material type other than the epitaxially grown semiconductor structure located between the lateral surface of the first mask layer region and the lateral surface of the second mask layer region.

BRIEF DESCRIPTION OF THE DRAWINGS

For a better understanding of the aforementioned aspects as well as additional aspects and embodiments thereof, reference should be made to the Description of Embodiments below, in conjunction with the following drawings.

FIGS. 5A-5E are partial cross-sectional views of a semiconductor substrate in accordance with some embodiments.

FIGS. 7A-7C are flow diagrams illustrating a method of removing nuclei formed during a selective epitaxial growth process in accordance with some embodiments.

Like reference numerals refer to corresponding parts throughout the figures.

Figure 1A:
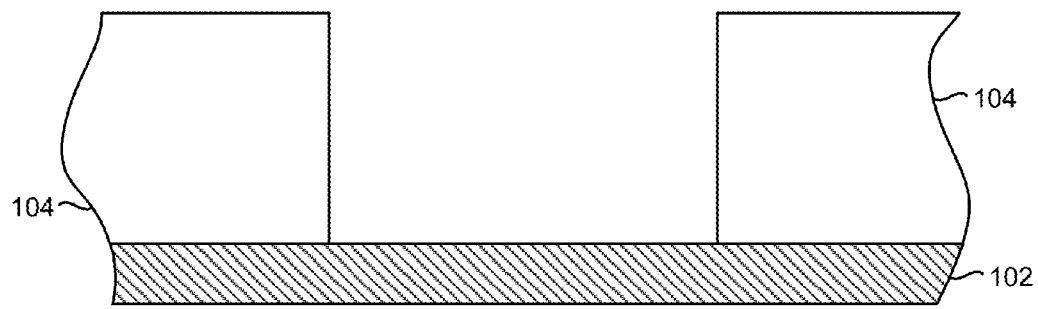
FIGS. 1A-1I are partial cross-sectional views of a semiconductor substrate in accordance with some embodiments.

Unless noted otherwise, the figures are not drawn to scale.

DESCRIPTION OF EMBODIMENTS

As explained above, formation of unwanted semiconductor structures in unwanted regions (e.g., over the masking material) can lead to poor electrical and/or mechanical properties of a semiconductor device. Certain growth conditions have been found to reduce formation of the unwanted semiconductor structures in unwanted regions.

For example, the substrate is exposed to an etchant (e.g., an HCl gas) during the epitaxial growth (e.g., by mixing the HCl gas with a deposition gas), thereby allowing etching of the unwanted semiconductor structures during the epitaxial growth. By maintaining the etching rate by the etchant higher than the rate at which the unwanted semiconductor structures are formed and lower than the rate of epitaxial growth (of the target semiconductor structures), formation of the unwanted semiconductor structures is reduced or suppressed. However, the presence of an etchant affects the speed of epitaxially growing semiconductor structures. The rate of forming the target semiconductor structures is impeded by the etching reaction, and thus, is slower than the rate of forming the target semiconductor structures in the absence of the etchant. Thus, the reduced rate of forming the target semiconductor structure can be a bottleneck in the overall device fabrication process. In addition, the presence of an etchant affects the shape of the epitaxially grown semiconductor structures. In particular, a ratio of a growth rate in a dominant direction to a growth rate in a non-dominant direction is increased significantly. For example, in germanium epitaxial growth, (100) is the dominant growth direction. When the ratio of the growth rate in the dominant direction to the growth rate in the non-dominant direction is increased, the resulting epitaxially grown germanium structures have a pyramid shape with (311) slope. Thus, the presence of the etchant makes it more challenging to obtain semiconductor structures with shapes different from the pyramid shape. Furthermore, if germanium having the pyramid shape with (311) slope is formed to cover a certain area, the height of the germanium pyramid can be high, which makes it challenging to obtain a planarized surface (e.g., by using a chemical mechanical planarization (CMP) process).

In another example, lowering the temperature and pressure during the epitaxial growth is believed to reduce formation of the unwanted semiconductor structures during the epitaxial growth. However, lowering the deposition temperature decreases the crystallinity of the grown semiconductor structures, which lead to increased leakage current in the semiconductor device. Lowering the pressure can lead to a lower deposition rate and increase the roughness of the semiconductor structures, which will degrade the performance of the fabricated device.

In yet another example, increasing a pressure of germane gas ($GeH_4$) facilitates growth of flat germanium islands, but increases formation of the unwanted semiconductor structures during the epitaxial growth. Similarly, increasing a pressure of hydrogen gas ($H_2$) facilitates growth of flat germanium islands, but increases formation of the unwanted semiconductor structures during the epitaxial growth.

Methods that address the above problems are described herein. By epitaxially growing semiconductor structures with no (or less) etchant, the semiconductor structures can be grown faster. In addition, the shape of the semiconductor structures is less affected by the etchant, because no (or less) etchant is present during the epitaxial growth. Furthermore, the pressure and/or temperature need not be lowered during the epitaxial growth. Although the epitaxial growth with no (or less) etchant (and at the normal pressure and temperature) will lead to formation of semiconductor structures on unwanted regions, such as on the masking material, such semiconductor structures on the unwanted regions are subsequently removed by an etching process. Thus, semiconductor structures epitaxially grown in target areas of the substrate can be obtained with no or reduced semiconductor structures grown in the unwanted regions.

Reference will be made to certain embodiments, examples of which are illustrated in the accompanying drawings. While the underlying principles will be described in conjunction with the embodiments, it will be understood that it is not intended to limit the scope of claims to these particular embodiments alone. On the contrary, the claims are intended to cover alternatives, modifications and equivalents that are within the scope of the claims.

Moreover, in the following description, numerous specific details are set forth to provide a thorough understanding of the present invention. However, it will be apparent to one of ordinary skill in the art that the invention may be practiced without these particular details. In other instances, methods, procedures, components, and networks that are well-known to those of ordinary skill in the art are not described in detail to avoid obscuring aspects of the underlying principles.

It will also be understood that, although the terms first, second, etc. may be used herein to describe various elements, these elements should not be limited by these terms. These terms are only used to distinguish one element from another. For example, a first group could be termed a second group, and, similarly, a second group could be termed a first group, without departing from the scope of the claims. The first group and the second group are both groups (e.g., of semiconductor structures), but they are not the same group.

The terminology used in the description of the embodiments herein is for the purpose of describing particular embodiments only and is not intended to limiting of the scope of claims. As used in the description and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

FIGS. 1A-1I are partial cross-sectional views of a semiconductor substrate in accordance with some embodiments.

FIG. 1A illustrates a substrate 102 and a mask layer 104 on the substrate 102. Although the substrate 102 is shown as a wafer in FIGS. 1A-1I, 2A-2C, 3A-3C, 4A-4C, and 5A-5E, the substrate 102 may include additional features not shown in FIGS. 1A-1I, 2A-2C, 3A-3C, 4A-4C, and 5A-5E. In some embodiments, the substrate 102 includes silicon devices (e.g., silicon complementary metal-oxide-semiconductor devices as well as any other structures typically formed during the front-end of the line (FEOL) processes). In some embodiments, the substrate 102 includes an oxide layer on the silicon devices (e.g., FIGS. 6A-6B).

In some embodiments, the mask layer 104 includes a dielectric material (e.g., silicon dioxide). In some embodiments, the mask layer 104 is made of a dielectric material (e.g., silicon dioxide). The mask layer 104 exposes one or more portions of the substrate 102. In some embodiments, the dielectric material is deposited on the substrate 102 and subsequently etched to expose the one or more portions of the substrate 102. In some embodiments, the substrate 102 is further etched. In some cases, this further etching provides a surface more suitable for epitaxial growth.

Figure 1B:
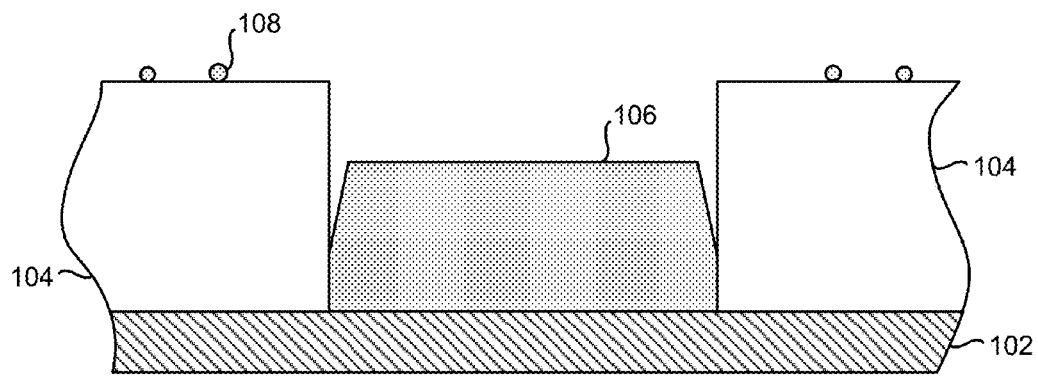

FIG. 1B illustrates that a semiconductor structure 106 (e.g., a germanium island) is epitaxially grown. The conditions (e.g., pressure, temperature, and chemical composition) for epitaxial growth of germanium are well known, and thus, are omitted herein for brevity. However, as explained above, the methods described herein do not require the use of an etchant (e.g., HCl gas) to suppress growth of semiconductor structures on the mask layer 104 during the epitaxial growth, although the use of an etchant is not precluded. The conditions for epitaxial growth can be adjusted to obtain the desired growth profile. Thus, it is possible to customize the shape of the epitaxially grown semiconductor structures.

FIG. 1B also illustrates that semiconductor structures 108 (e.g., particles, which are also called herein nuclei) are also formed on the mask layer 104 during the epitaxial growth of the semiconductor structure 106. The semiconductor structures 108 typically have amorphous and/or poly-crystalline structures, whereas the semiconductor structure 106 has a crystalline structure.

Figure 1C:
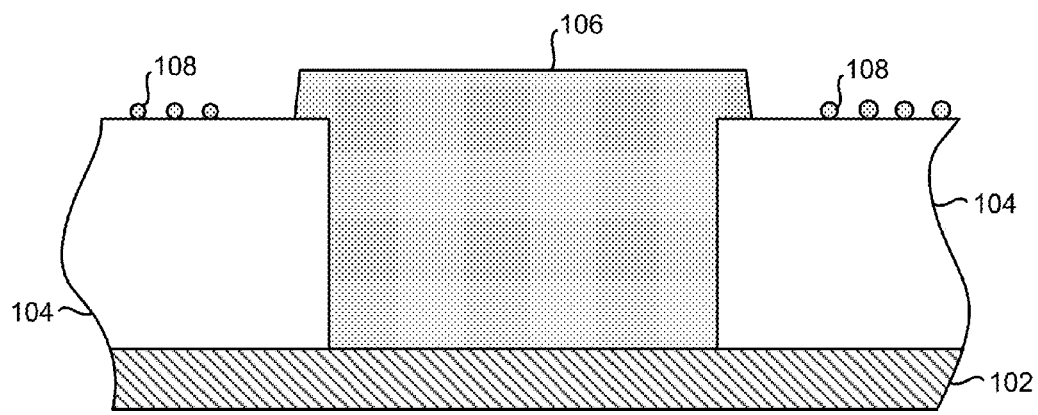
Figure 8A:
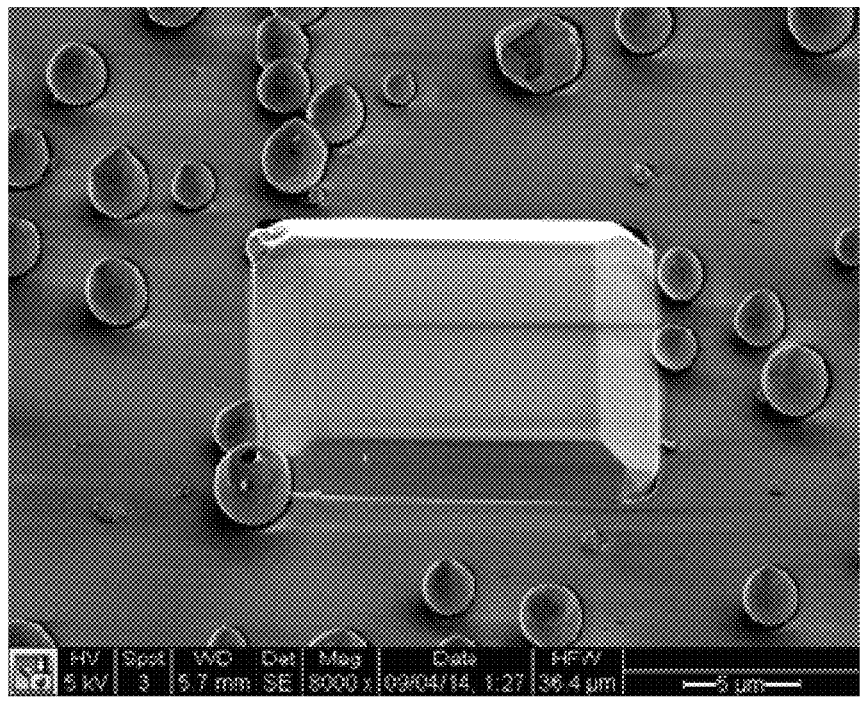
FIGS. 8A-8B are scanning electron microscope (SEM) images of a semiconductor substrate prior to an etching process in accordance with some embodiments.
Figure 8B:
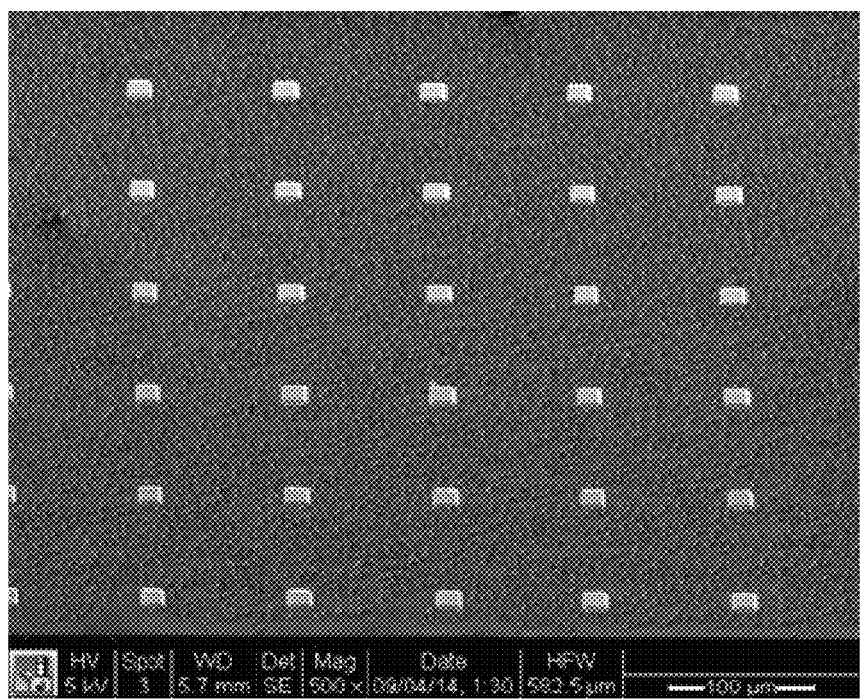

FIG. 1C illustrates that the semiconductor structure 106 continues to grow. FIG. 1C also illustrates that additional semiconductor structures 108 are formed on the mask layer 104. FIGS. 8A and 8B are scanning electron microscope (SEM) images of a substrate after epitaxial growth of a germanium island, which are described in detail below.

Figure 1D:
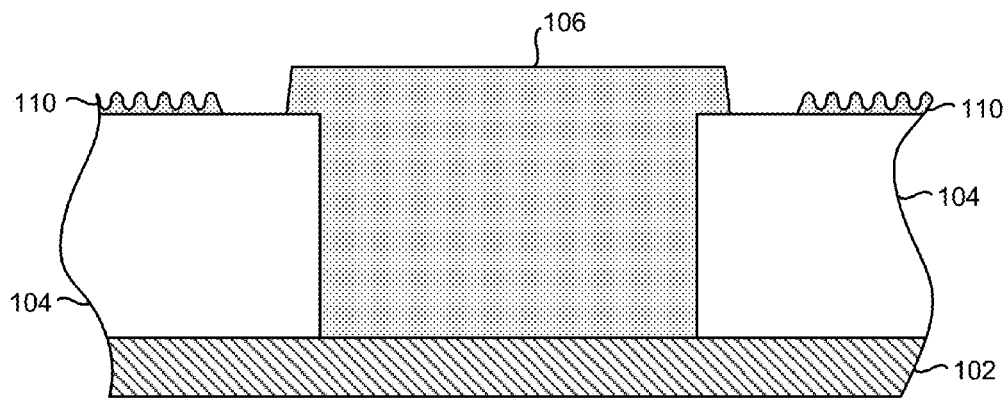

FIG. 1D illustrates that the semiconductor structures 108 are aggregated to form a film 110 in some embodiments.

Figure 1E:
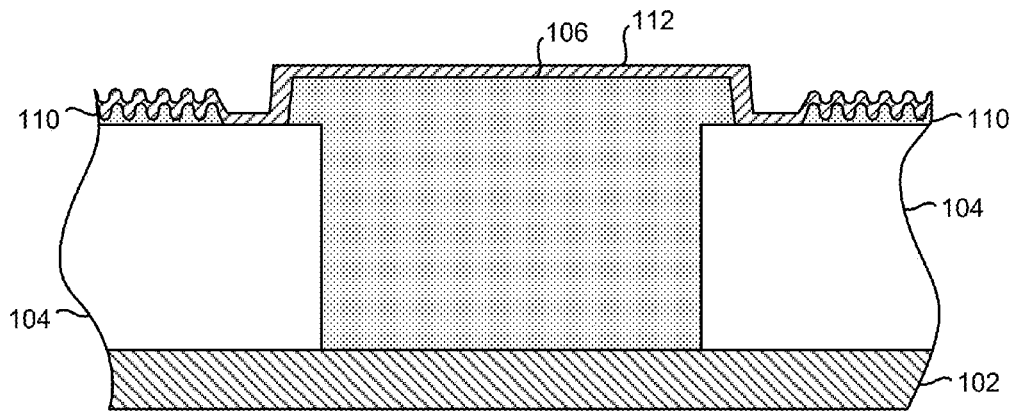

FIG. 1E illustrates that optionally, an adhesive layer 112 is applied (e.g., deposited) over the substrate 102. In FIG. 1E, the adhesive layer 112 covers the semiconductor structure 106 and the film 110 on the mask layer 104. In some embodiments, the adhesive layer 112 is a low-thermal oxide. In some embodiments, the adhesive layer 112 is hexamethyldisilazane (HMDS). In some embodiments, the adhesive layer 112 promotes adhesion between the epitaxially grown semiconductor structure 106 and photoresist.

Figure 1F:
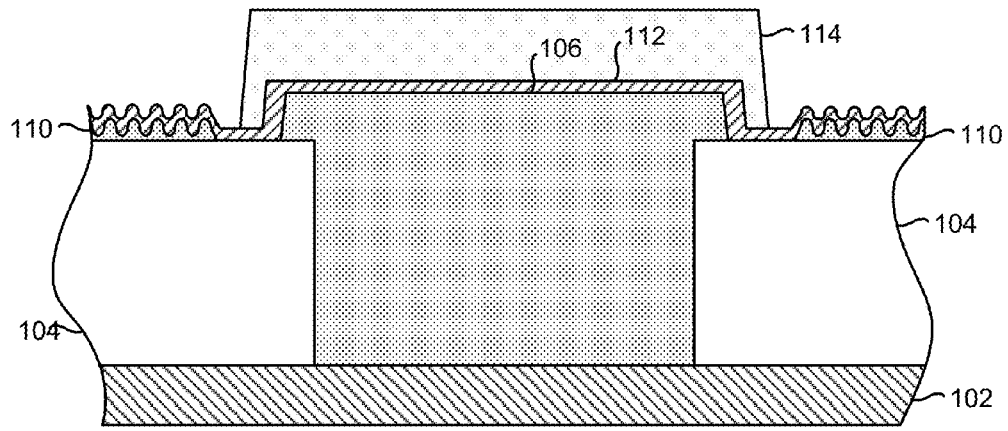

FIG. 1F illustrates a protective layer 114 (e.g., a photo resist layer) is applied over the substrate 102. In FIG. 1F, the protective layer 114 covers a portion of the adhesive layer 112 over the semiconductor structure 106. In FIG. 1F, the protective layer 114 does not cover the film 110 (e.g., the film 110 is exposed from the protective layer 114, although the film 110 is covered with the adhesive layer 112).

Figure 1G:
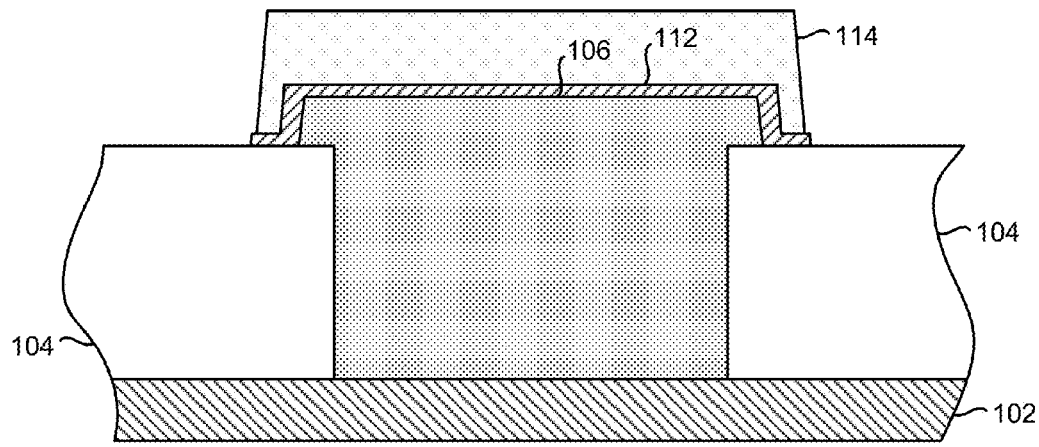

FIG. 1G illustrates that regions not covered by the protective layer 114 have been etched. As a result of etching, the film 110 (and any other unwanted semiconductor structures formed during the epitaxial growth of the semiconductor structure 106) is removed. In addition, a portion of the adhesive layer 112 located over the film 110 is also removed. In some embodiments, a selective etching process, which removes the film 110 (and any other unwanted semiconductor structures formed during the epitaxial growth of the semiconductor structure 106) faster than protective layer 114, is used (such etching processes are called to have high selectivity) so that the semiconductor structure 106 is maintained while the film 110 and/or any other unwanted semiconductor structures formed during the epitaxial growth of the semiconductor structure 106 are removed. In some embodiments, the etching process is a dry etching process (e.g., plasma etching, deep reactive ion etching, etc.). In some embodiments, the etching process is a wet etching process (e.g., etching with liquid-phase etchants). For example, an advanced silicon etching instrument manufactured by Surface Technology Systems Plc. may be used for the selective etching.

Figure 1H:
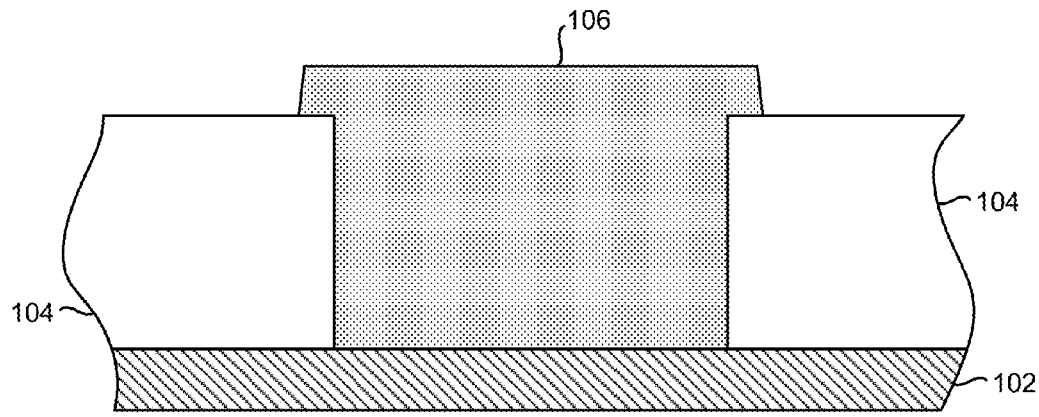
Figure 9A:
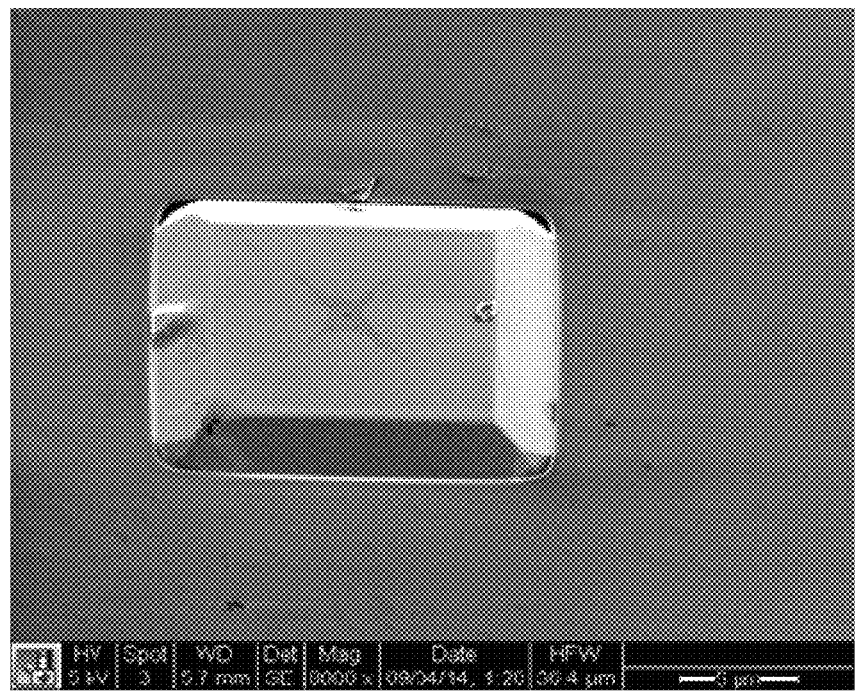
FIGS. 9A-9B are scanning electron microscope (SEM) images of a semiconductor substrate subsequent to an etching process in accordance with some embodiments.
Figure 9B:
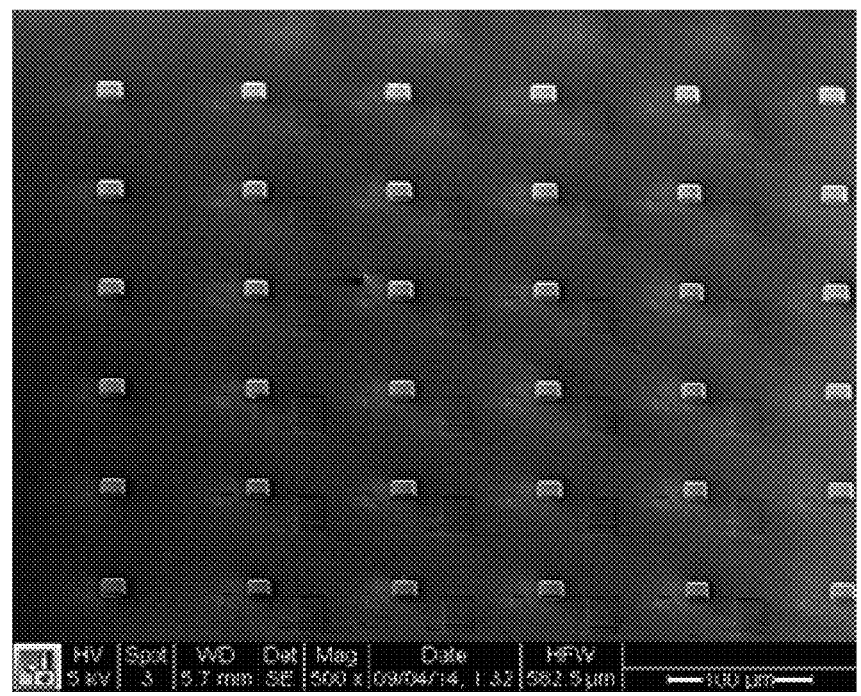

FIG. 1H illustrates that the protective layer 114 and the adhesive layer 112 are removed. FIGS. 9A and 9B are scanning electron microscope (SEM) images of a substrate after removing the protective layer 114, which are described in detail below.

Figure 1I:
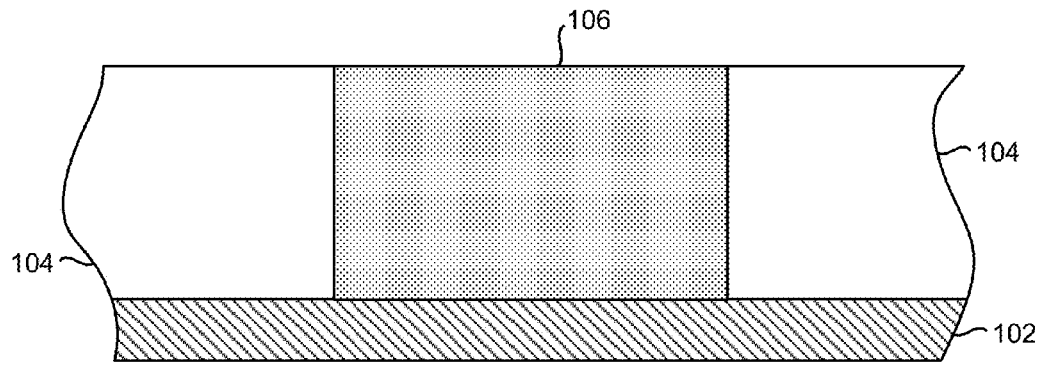

FIG. 1I illustrates that the semiconductor structure 106 is planarized (e.g., using a CMP process). Because the unwanted semiconductor structures (e.g., nuclei 108 or film 110) have been removed, a CMP process can be readily applied. In addition, because the shape of the semiconductor structure 106 can be adjusted to have a flat top, it is easier to perform a CMP process.

Figure 2A:
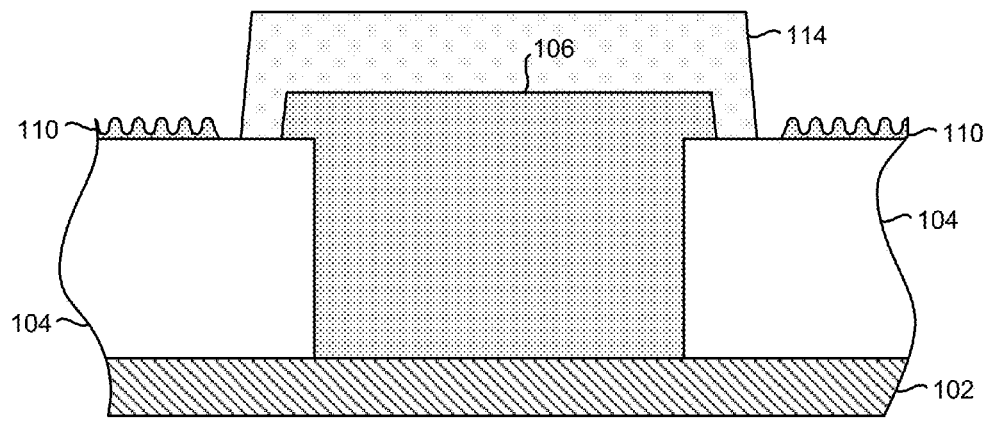
FIGS. 2A-2C are partial cross-sectional views of a semiconductor substrate in accordance with some embodiments.
Figure 2B:
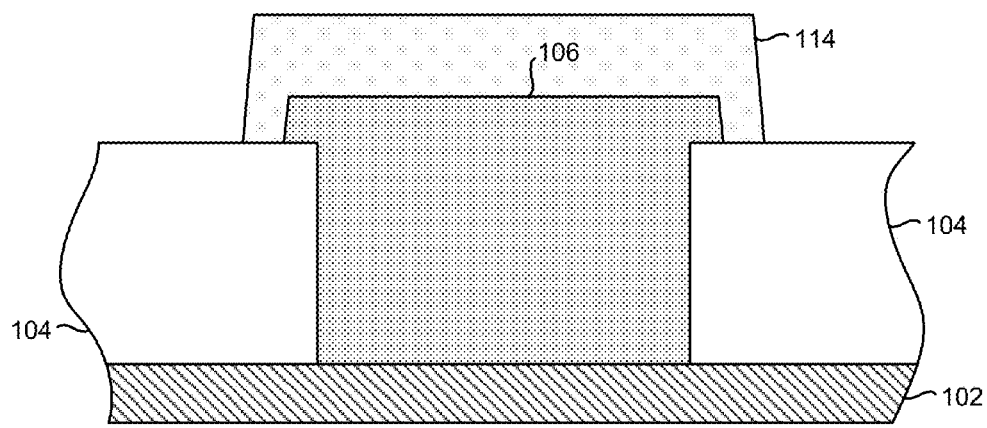
Figure 2C:
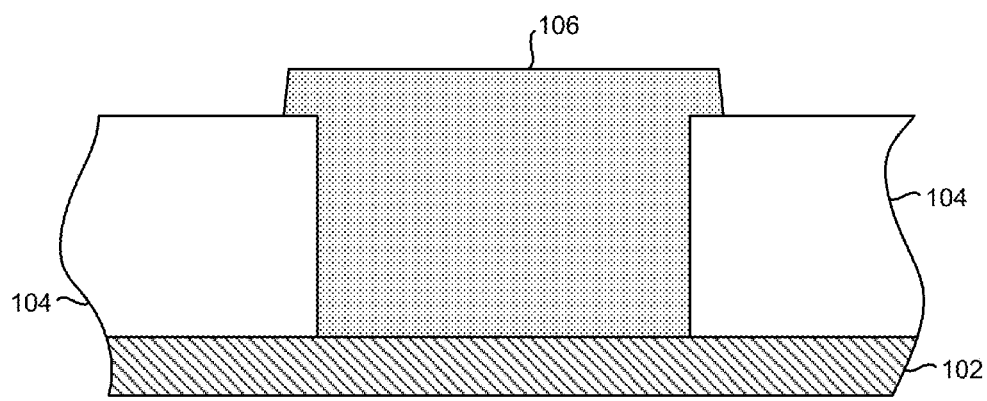

FIGS. 2A-2C are partial cross-sectional views of a semiconductor substrate in accordance with some embodiments.

The processes illustrated in FIGS. 2A-2C are similar to those illustrated in FIGS. 1F-1H except that the optional adhesive layer 112 (FIG. 1E) is not used. FIG. 2A illustrates that the protective layer 114 is applied directly on the semiconductor structure 106 shown in FIG. 1D.

FIG. 2B illustrates that regions not covered by the protective layer 114 have been etched, which is similar to the process described above with respect to FIG. 1G. As a result of etching, the film 110 (and any other unwanted semiconductor structures formed during the epitaxial growth of the semiconductor structure 106) is removed.

FIG. 2C illustrates that the protective layer 114 is removed, which is similar to the process described above with respect to FIG. 1H. Subsequently, the semiconductor structure 106 can be planarized, as described above with respect to FIG. 1I.

Figure 3A:
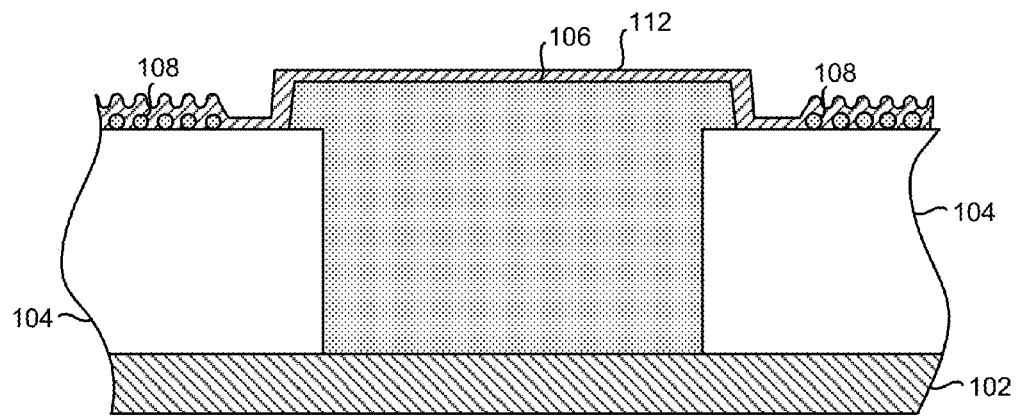
FIGS. 3A-3C are partial cross-sectional views of a semiconductor substrate in accordance with some embodiments.
Figure 3B:
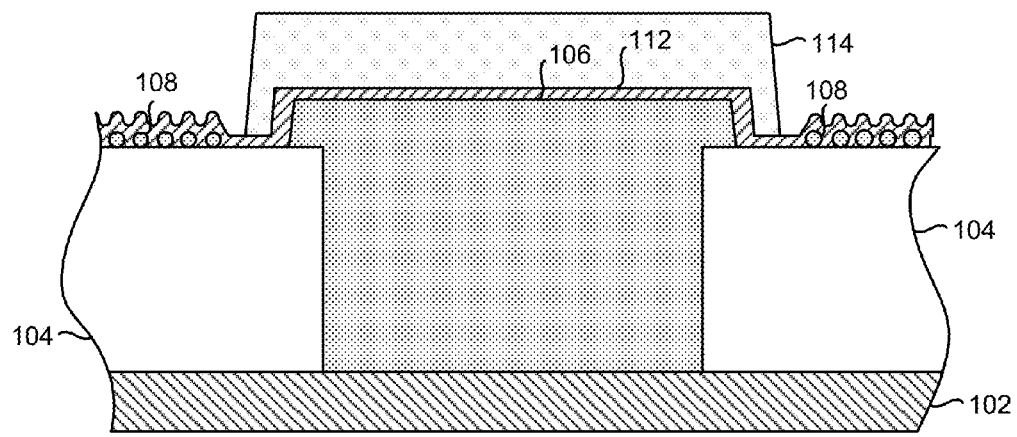
Figure 3C:
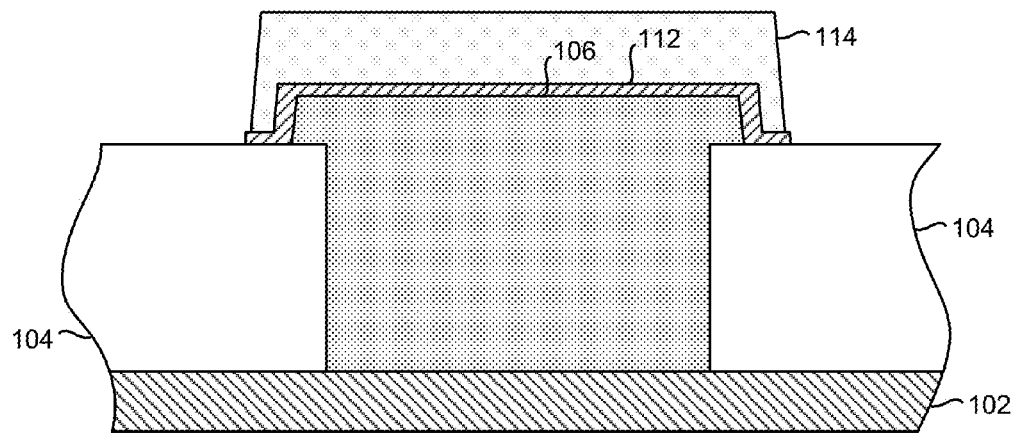

FIGS. 3A-3C are partial cross-sectional views of a semiconductor substrate in accordance with some embodiments.

The processes illustrated in FIGS. 3A-3C are similar to those illustrated in FIGS. 1E-1G except that the semiconductor structures 108 (e.g., particles) remain separate.

FIG. 3A illustrates that the adhesive layer 112 is applied over the semiconductor structure 106 and the semiconductor structures 108 (e.g., particles) on the mask layer 104, which is analogous to the process described above with respect to FIG. 1E.

FIG. 3B illustrates that the protective layer 114 is applied over the substrate 102, which is analogous to the process described above with respect to FIG. 1F.

FIG. 3C illustrates that regions not covered by the protective layer 114 have been etched, which is similar to the process described above with respect to FIG. 1G. As a result of etching, the semiconductor structures 108 are removed. In addition, a portion of the adhesive layer 112 located over the semiconductor structures 108 is also removed.

In some embodiments, the semiconductor substrate illustrated in FIG. 3C is further processed as described above with respect to FIGS. 1H and 1I. For example, the protective layer 114 and the adhesive layer 112 are removed and the semiconductor structure 106 is planarized to obtain the semiconductor substrate illustrated in FIG. 1I.

Figure 4A:
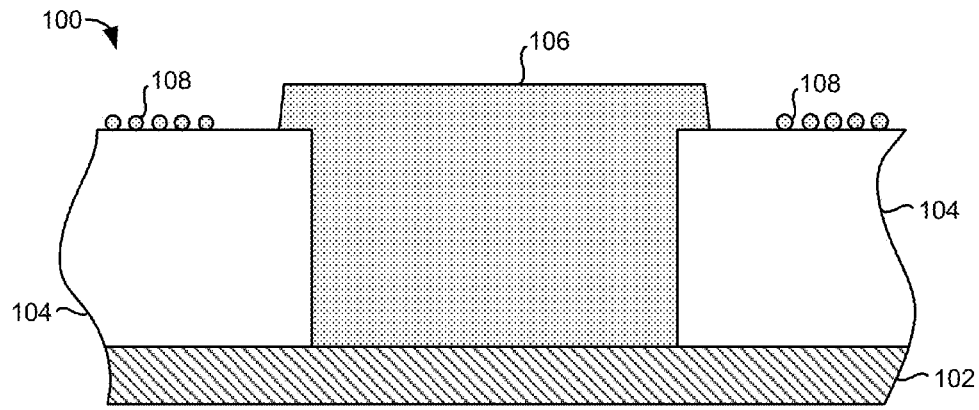
FIGS. 4A-4C are partial cross-sectional views of a semiconductor substrate in accordance with some embodiments.
Figure 4B:
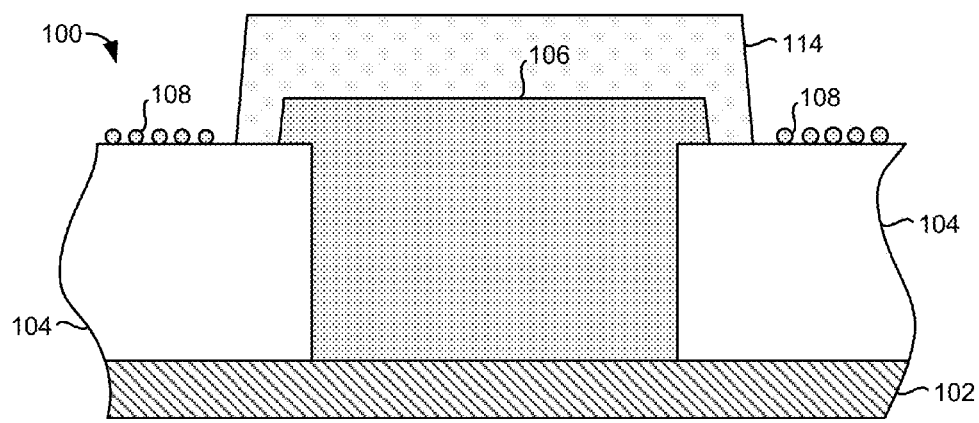
Figure 4C:
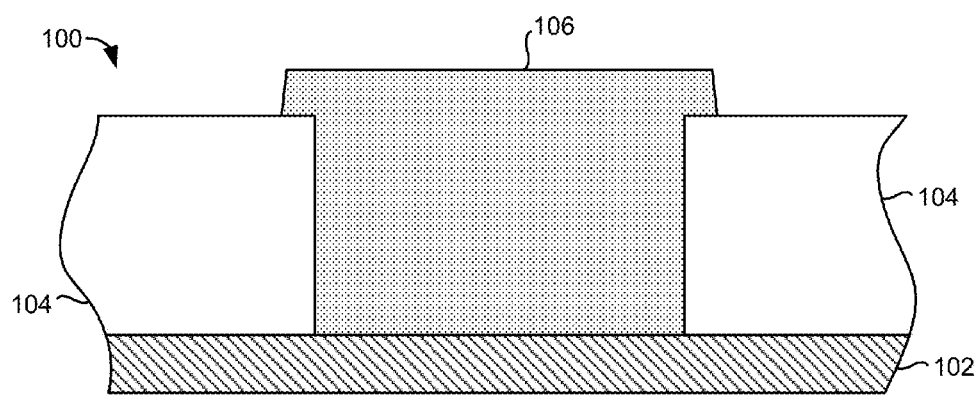

FIGS. 4A-4C are partial cross-sectional views of a semiconductor substrate in accordance with some embodiments.

The processes illustrated in FIGS. 4A-4C are similar to those illustrated in FIGS. 2A-2C except that the semiconductor structures 108 (e.g., particles) remain separate.

FIG. 4A illustrates that the protective layer 114 is applied directly on the semiconductor structure 106 before the semiconductor structures 108 are aggregated.

FIG. 4B illustrates that regions not covered by the protective layer 114 have been etched, which is similar to the process described above with respect to FIG. 2B. As a result of etching, the semiconductor structures 108 are removed.

FIG. 4C illustrates that the protective layer 114 is removed, which is similar to the process illustrated described above with respect to FIG. 2C. Subsequently, the semiconductor structure 106 can be planarized, as described above with respect to FIG. 1I.

FIGS. 5A-5E are partial cross-sectional views of a semiconductor substrate in accordance with some embodiments.

FIGS. 5A-5E clarify that the processes illustrated in FIGS. 1A-1I can be performed in forming multiple semiconductor structures (e.g., germanium islands) on a single semiconductor substrate.

Figure 5A:
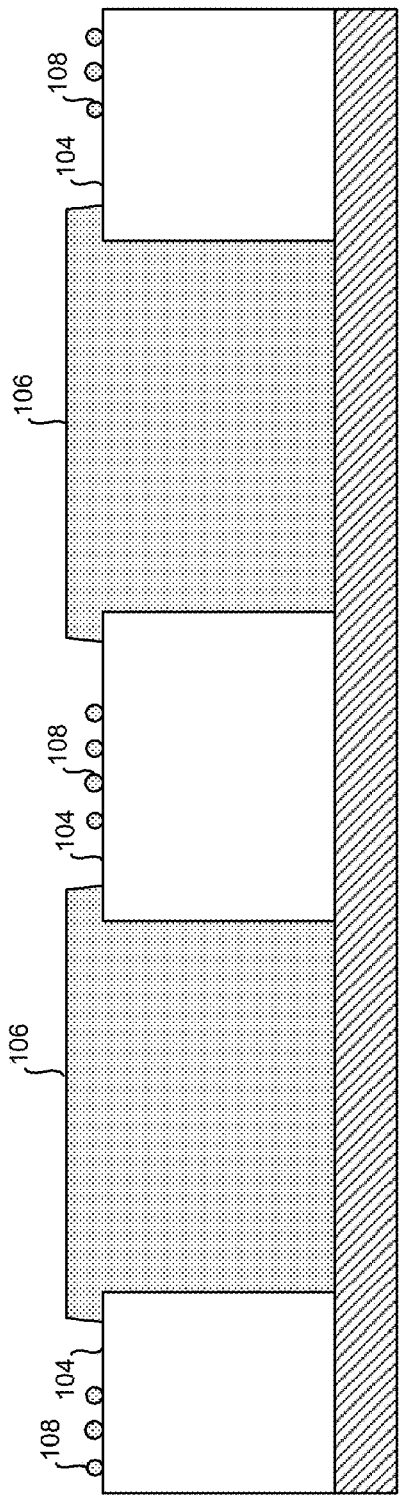

FIG. 5A illustrates that semiconductor structures 106 are epitaxially grown and that semiconductor structures 108 are formed on the mask layer 104.

Figure 5B:
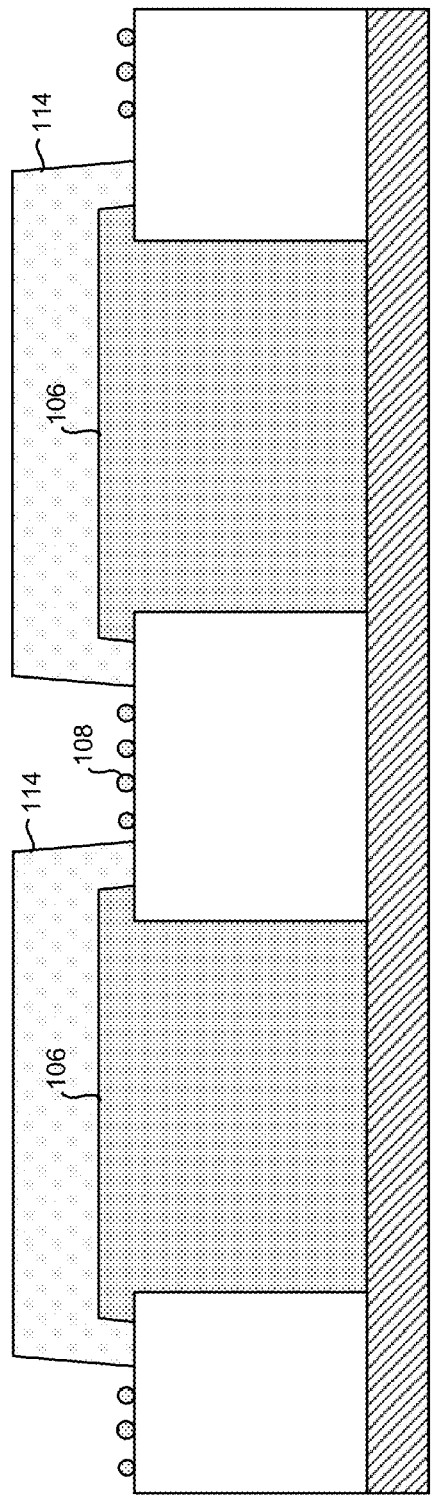

FIG. 5B illustrates that a protective layer 114 is applied on the semiconductor structures 106 while exposing the semiconductor structures 108.

Figure 5C:
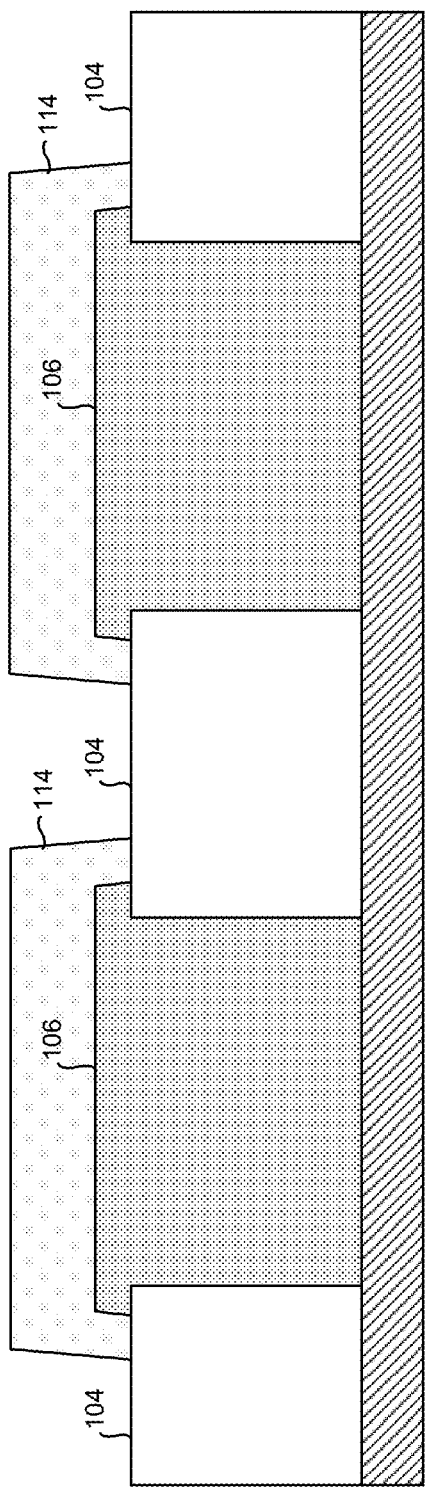

FIG. 5C illustrates that the semiconductor structures 108 are removed by etching.

Figure 5D:
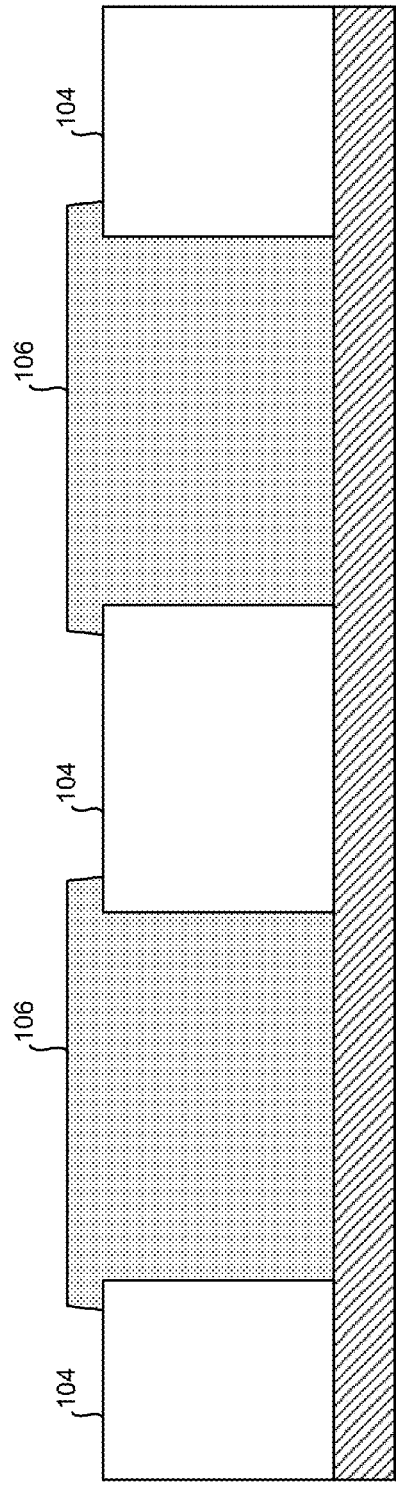

FIG. 5D illustrates that the protective layer 114 is removed.

FIG. 5E illustrates that the semiconductor structures 106 are planarized (e.g., using a CMP process).

Certain features described with respect to FIGS. 1A-1I, 2A-2C, 3A-3C, and 4A-4C can be applied analogously to the processes illustrated in FIGS. 5A-5E. For example, the adhesive layer 112 may be applied over the semiconductor structures 106 before the protective layer 114 is applied (or formed) over the semiconductor structures 106. For brevity, such details are not repeated herein.

Figure 6A:
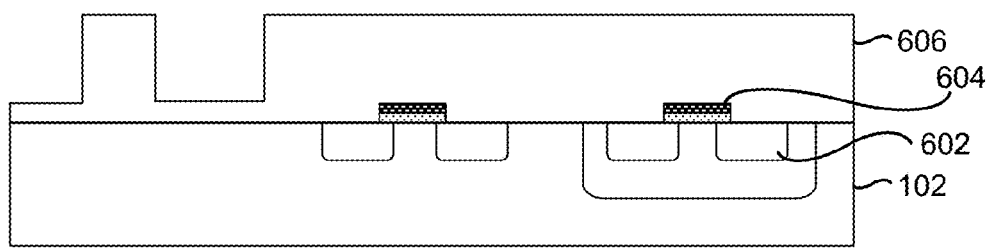
FIGS. 6A-6B are partial cross-sectional views of a semiconductor substrate in accordance with some embodiments.
Figure 6B:
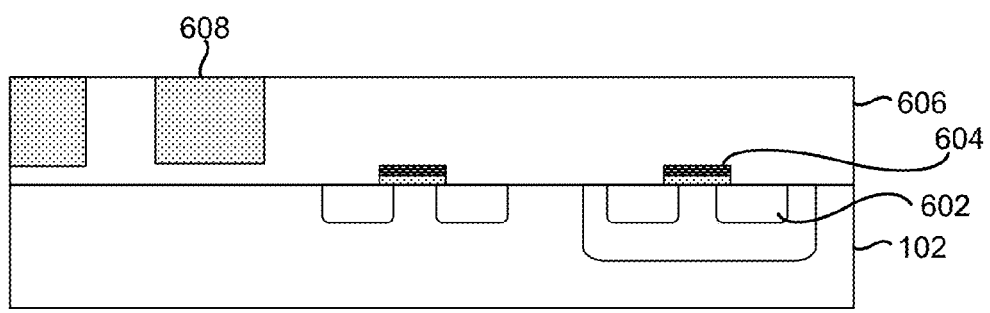

FIGS. 6A-6B are partial cross-sectional views of a semiconductor substrate in accordance with some embodiments.

FIG. 6A illustrates that the substrate 102 includes complementary metal-oxide-semiconductor (CMOS) devices with source/drains 602 and gates 604. In FIG. 6A, a mask layer 606 (e.g., silicon dioxide) is formed on the substrate 102. In some embodiments, the mask layer 606 includes silicon dioxide of at least 2 μm thickness, for growing a germanium layer thereon. The thickness of the silicon dioxide was found to improve the quality of the crystallinity of the epitaxially grown germanium.

FIG. 6B illustrates that a semiconductor structure 608 (e.g., germanium) is formed using the processes described above with respect to FIGS. 1A-1I, 2A-2C, 3A-3C, 4A-4C, and 5A-5E.

FIGS. 7A-7C are flow diagrams illustrating a method 700 of removing nuclei formed during a selective epitaxial growth process in accordance with some embodiments.

The method 700 includes (702) epitaxially growing a first group of one or more semiconductor structures (e.g., the semiconductor structure 106 in FIG. 1B) over a substrate (e.g., a silicon substrate) with one or more mask layers (e.g., the substrate 102 with the mask layer 104 in FIG. 1B). A second group of a plurality of semiconductor structures (e.g., semiconductor structures 108 in FIG. 1B) is formed on the one or more mask layers. In some embodiments, the second group of the plurality of semiconductor structures is formed concurrently with epitaxially growing the first group of the one or more semiconductor structures. In some embodiments, a first semiconductor structure of the first group of one or more semiconductor structures is larger than a second semiconductor structure of the second group of the plurality of semiconductor structures. In some embodiments, the one or more semiconductor structures are homo-epitaxially grown. In some embodiments, the one or more semiconductor structures are hetero-epitaxially grown.

In some embodiments, the first group of the one or more semiconductor structures is formed (704) in a single epitaxial growth process. For example, in FIGS. 1B-1C, the semiconductor structure 106 is formed in a single epitaxial growth process (e.g., instead of epitaxially growing a portion of the semiconductor structure 106, etching a portion of the semiconductor structure 106, and epitaxially growing an additional portion of the semiconductor structure 106).

In some embodiments, the method 700 includes (706) forming a plurality of semiconductor particles (e.g., the semiconductor structures 108 in FIG. 1C) on the one or more mask layers (e.g., the mask layer 104 in FIG. 1C) while epitaxially growing the first group of one or more semiconductor structures (e.g., the semiconductor structure 106 in FIG. 1C) on the substrate with one or more mask layers. In some embodiments, the second group of the plurality of semiconductor structures includes the plurality of semiconductor particles.

In some embodiments, the second group of the plurality of semiconductor structures includes (708) a semiconductor film (e.g., the semiconductor film 110 in FIG. 1D) on the one or more mask layers. In some embodiments, the second group of the plurality of semiconductor structures includes one or more semiconductor films on the one or more mask layers.

In some embodiments, the first group of one or more semiconductor structures includes (710) a column IV material (e.g., silicon, germanium, SiGe, etc.). In some embodiments, the first group of one or more semiconductor structures includes one or more III-V materials (e.g., GaAs, InGaAs, etc.).

In some embodiments, the first group of one or more semiconductor structures includes (712) germanium.

In some embodiments, the first group of one or more semiconductor structures is formed (714) on one or more regions of the substrate that are exposed from the one or more mask layers (e.g., not covered by the one or more mask layers). For example, in FIG. 5A, the semiconductor structures 106 are formed on the regions of the substrate that are exposed from the mask layer 104.

In some embodiments, the first group of one or more semiconductor structures has (716) crystalline structures and the second group of the plurality of semiconductor structures has amorphous and/or poly-crystalline structures. For example, see FIG. 8A, which shows that the first group of one or more semiconductor structures (e.g., the germanium island) has a crystalline structure and the second group of semiconductor structures has amorphous and/or poly-crystalline structures.

In some embodiments, the one or more mask layers include (718) a dielectric material.

In some embodiments, the one or more mask layers include (720) silicon dioxide.

The method 700 also includes (722, FIG. 7B) forming one or more protective layers (e.g., the protective layer 114 in FIG. 1F, such as one or more photoresist layers) over the first group of one or more semiconductor structures. At least a subset of the second group of the plurality of semiconductor structures is exposed from the one or more protective layers. For example, in FIG. 1F, the film 110 is exposed from the protective layer 114. In some embodiments, the one or more protective layers are in direct contact with the first group of one or more semiconductor structures (e.g., FIG. 2A). In some embodiments, one or more intermediate layers (e.g., one or more adhesive layers, such as hexamethyldisilazane (HMDS) or low-temperature thermal oxide) are located between the first group of one or more semiconductor structures and the one or more protective layers (e.g., FIG. 1F).

In some embodiments, the method 700 includes (724) foregoing etching at least the subset of the second group of the plurality of semiconductor structures before the one or more protective layers are formed over the first group of one or more semiconductor structures. For example, in some embodiments, the second group of the plurality of semiconductor structures is not etched until after the one or more protective layers are formed over the one or more semiconductor structures to protect the one or more semiconductor structures from the etching process.

In some embodiments, the method 700 includes (726) foregoing etching at least the subset of the second group of the plurality of semiconductor structures subsequent to initiating the epitaxial growth of the first group of one or more semiconductor structures on the substrate until the one or more protective layers are formed over the first group of one or more semiconductor structures. For example, etching of at least the subset of the second group of the plurality of semiconductor structures is foregone during the epitaxial growth of the first group of one or more semiconductor structures. In some embodiments, etching at least the subset of the plurality of semiconductor structures is foregone after initiating the epitaxial growth of the first group of one or more semiconductor structures on the substrate and before forming the one or more protective layers over the one or more semiconductor structures.

In some embodiments, the one or more protective layers include (728) one or more photoresist layers. In some embodiments, the one or more protective layers are one or more photoresist layers.

In some embodiments, the method 700 includes (730) depositing one or more adhesive layers over at least the first group of one or more semiconductor structures prior to forming the one or more protective layers. For example, as illustrated in FIGS. 1E-1F, the adhesive layer 112 is applied over the semiconductor structure 106 before the protective layer 114 is applied. In some embodiments, the one or more adhesive layers are deposited on at least the first group of one or more semiconductor structures.

In some embodiments, the one or more adhesive layers include (732) hexamethyldisilazane and/or low-temperature thermal oxide.

In some embodiments, the method includes, subsequent to etching at least the subset of the second group of the plurality of semiconductor structures, removing the one or more adhesive layers. In some embodiments, the one or more protective layers and the one or more adhesive layers are removed concurrently. In some embodiments, the one or more protective layers are removed subsequent to removing the one or more adhesive layers.

In some embodiments, the substrate includes silicon. In some embodiments, the substrate is a silicon substrate.

In some embodiments, the substrate includes (734) a plurality of semiconductor devices thereon (e.g., FIGS. 6A-6B). For example, the substrate may include a plurality of transistors prior to epitaxially growing the first group of one or more semiconductor structures.

In some embodiments, the substrate includes a plurality of transistors and a semiconductor structure of the first group of one or more semiconductor structures is electrically coupled to a source or a drain of a transistor of the plurality of transistors.

In some embodiments, the substrate includes (736) a plurality of complementary metal-oxide semiconductor (CMOS) devices thereon (e.g., FIGS. 6A-6B).

In some embodiments, the substrate includes thereon a plurality of complementary metal-oxide semiconductor devices, including a p-type metal-oxide-semiconductor transistor and an n-type metal-oxide-semiconductor transistor. In some embodiments, the method includes electrically coupling a first semiconductor structure of the first group of one or more semiconductor structures to a source or a drain of one of: the p-type metal-oxide-semiconductor transistor or the n-type metal-oxide-semiconductor transistor.

In some embodiments, the plurality of semiconductor devices is located (738) on the substrate below the one or more mask layers. For example, in FIGS. 6A-6B, the semiconductor devices (e.g., transistors) are located below the mask layer 606. In some embodiments, the plurality of semiconductor devices is located in the front-end of the line (FEOL) region of the substrate.

The method 700 further includes (740, FIG. 7C), subsequent to forming the one or more protective layers over the first group of one or more semiconductor structures, etching at least the subset of the second group of the plurality of semiconductor structures. For example, in FIGS. 1F-1G, the film 110 is removed due to the etching process. In some embodiments, at least the subset of the plurality of semiconductor structures that is exposed from the one or more photoresist layers is completely etched (e.g., removed). In some embodiments, at least the subset of the plurality of semiconductor structures that is exposed from the one or more photoresist layers is at least partially etched (e.g., removed). In some embodiments, one or more semiconductor structures of at least the subset of the plurality of semiconductor structures that is exposed from the one or more photoresist layers are etched (e.g., removed). In some embodiments, the entire second group of the plurality of semiconductor structures formed on the one or more mask layers is etched (e.g., removed).

In some embodiments, the method includes etching the entire subset of the second group of the plurality of semiconductor structures that is exposed from the one or more protective layers.

In some embodiments, the method 700 includes (742), subsequent to etching at least the subset of the second group of the plurality of semiconductor structures, removing the one or more protective layers (e.g., FIG. 1H) and/or planarizing at least a subset of the first group of one or more semiconductor structures (e.g., using chemical-mechanical planarization). In some embodiments, the method 700 includes, subsequent to etching at least the subset of the second group of the plurality of semiconductor structures, removing the one or more protective layers. In some embodiments, the method 700 includes, subsequent to etching at least the subset of the second group of the plurality of semiconductor structures, planarizing at least a subset of the first group of one or more semiconductor structures. For example, in FIG. 1I, the semiconductor structure 106 is planarized.

In some embodiments, etching at least the subset of the second group of the plurality of semiconductor structures includes (744) etching at least the subset of the second group of the plurality of semiconductor structures at a first rate and etching the one or more mask layers at a second rate that is lower than the first rate. For example, in FIGS. 1F-1G, the film 110 is etched faster than the mask layer 104 and the protective layer 114. In some embodiments, etching at least the subset of the second group of the plurality of semiconductor structures includes etching at least the subset of the second group of the plurality of semiconductor structures without etching the one or more mask layers. In some embodiments, the film 110 shown in FIG. 1F is etched while the mask layer 104 and the protective layer 114 are not etched.

In some embodiments, etching at least the subset of the second group of the plurality of semiconductor structures includes foregoing etching of the one or more mask layers.

In some embodiments, etching at least the subset of the second group of the plurality of semiconductor structures includes (744) etching at least the subset of the second group of the plurality of semiconductor structures at a first rate and etching at least a subset of the first group of one or more semiconductor structures at a third rate that is lower than the first rate. For example, in FIGS. 1F-1G, the film 110 is etched faster than the semiconductor structure 106. In some embodiments, etching at least the subset of the second group of the plurality of semiconductor structures includes etching at least the subset of the second group of the plurality of semiconductor structures without etching the first group of one or more semiconductor structures. In some embodiments, the film 110 shown in FIG. 1F is etched while the semiconductor structure 106 is not etched (e.g., because the semiconductor structure 106 is protected by the protective layer 114).

Certain features of the method 700 described with respect to FIGS. 7A-7C can be applied to processes illustrated in FIGS. 1A-1I, 2A-2C, 3A-3C, 4A-4C, 5A-5E, and 6A-6B. For brevity, these details are not repeated.

FIGS. 8A-8B are scanning electron microscope (SEM) images of a semiconductor substrate prior to an etching process in accordance with some embodiments.

Shown in FIGS. 8A and 8B are top-down views of the semiconductor substrate that corresponds to FIG. 1C.

FIG. 8A shows a germanium island that corresponds to the semiconductor structure 106 in FIG. 1C (before the etching process). In addition, the second group of semiconductor structures is formed around the germanium island on the mask layer.

FIG. 8B is a zoomed-out view of the semiconductor substrate. Multiple germanium islands and the second group of semiconductor structures formed on the mask layer are shown in FIG. 8B.

FIGS. 9A-9B are scanning electron microscope (SEM) images of a semiconductor substrate subsequent to an etching process in accordance with some embodiments.

FIG. 9A shows a germanium island that corresponds to the semiconductor structure 106 in FIG. 1H (after the etching process). FIG. 9A shows the absence of the second group of semiconductor structures around the germanium island on the mask layer.

FIG. 9B is a zoomed-out view of the semiconductor substrate. Multiple germanium islands without the second group of semiconductor structures are shown in FIG. 9B.

Thus, FIGS. 9A-9B show the effectiveness of the described methods in removing the second group of semiconductor structures formed on the one or more mask layers.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. A method for removing nuclei formed during a selective epitaxial growth process, comprising:
   epitaxially growing a first group of one or more semiconductor structures over a substrate with one or more mask layers, wherein a second group of a plurality of semiconductor structures is formed on the one or more mask layers;
   forming one or more protective layers over the first group of one or more semiconductor structures, wherein at least a subset of the second group of the plurality of semiconductor structures is exposed from the one or more protective layers; and,
   subsequent to forming the one or more protective layers over the first group of one or more semiconductor structures, etching at least the subset of the second group of the plurality of semiconductor structures.

2. The method of claim 1, including:
   foregoing etching at least the subset of the second group of the plurality of semiconductor structures before the one or more protective layers are formed over the first group of one or more semiconductor structures.

3. The method of claim 1, including:
   foregoing etching at least the subset of the second group of the plurality of semiconductor structures subsequent to initiating the epitaxial growth of the first group of one or more semiconductor structures on the substrate until the one or more protective layers are formed over the first group of one or more semiconductor structures.

4. The method of claim 1, wherein the first group of the one or more semiconductor structures is formed in a single epitaxial growth process.

5. The method of claim 1, wherein:
   the one or more protective layers include one or more photoresist layers.

6. The method of claim 1, including:
   depositing one or more adhesive layers over at least the first group of one or more semiconductor structures prior to forming the one or more protective layers.

7. The method of claim 6, wherein the one or more adhesive layers include hexamethyldisilazane and/or low-temperature thermal oxide.

8. The method of claim 6, including:
   subsequent to etching at least the subset of the second group of the plurality of semiconductor structures, removing the one or more adhesive layers.

9. The method of claim 8, wherein the one or more protective layers and the one or more adhesive layers are removed concurrently.

10. The method of claim 8, wherein the one or more protective layers are removed subsequent to removing at least a portion of the one or more adhesive layers.

11. The method of claim 1, further including:
    subsequent to etching at least the subset of the second group of the plurality of semiconductor structures, removing the one or more protective layers.

12. The method of claim 1, further including:
    subsequent to etching at least the subset of the second group of the plurality of semiconductor structures, planarizing at least a subset of the first group of one or more semiconductor structures.

13. The method of claim 1, including:
    forming a plurality of semiconductor particles on the one or more mask layers while epitaxially growing the first group of one or more semiconductor structures on the substrate with one or more mask layers.

14. The method of claim 1, wherein the second group of the plurality of semiconductor structures includes one or more semiconductor films on the one or more mask layers.

15. The method of claim 1, wherein the first group of one or more semiconductor structures includes a column IV material.

16. The method of claim 1, wherein the first group of one or more semiconductor structures includes germanium.

17. The method of claim 1, wherein the first group of one or more semiconductor structures is formed on one or more regions of the substrate that are exposed from the one or more mask layers.

18. The method of claim 1, wherein the first group of one or more semiconductor structures has crystalline structures and the second group of the plurality of semiconductor structures has amorphous and/or poly-crystalline structures.

19. The method of claim 1, wherein the one or more mask layers include a dielectric material.

20. The method of claim 1, wherein the one or more mask layers include silicon dioxide.

21. The method of claim 1, wherein etching at least the subset of the second group of the plurality of semiconductor structures includes etching at least the subset of the second group of the plurality of semiconductor structures at a first rate and etching the one or more mask layers at a second rate that is lower than the first rate.

22. The method of claim 1, wherein etching at least the subset of the second group of the plurality of semiconductor structures includes foregoing etching of the one or more mask layers.

23. The method of claim 1, wherein the substrate includes a plurality of semiconductor devices thereon.

24. The method of claim 23, wherein the plurality of semiconductor devices is located on the substrate below the one or more mask layers.

25. The method of claim 23, wherein the substrate includes a plurality of transistors thereon and a semiconductor structure of the first group of one or more semiconductor structures is electrically coupled to a source or a drain of a transistor of the plurality of transistors.

26. The method of claim 25, wherein the substrate includes thereon a plurality of complementary metal-oxide semiconductor devices, including a p-type metal-oxide-semiconductor transistor and an n-type metal-oxide-semiconductor transistor.

27. The method of claim 26, including:
electrically coupling a first semiconductor structure of the first group of one or more semiconductor structures to a source or a drain of one of: the p-type metal-oxide-semiconductor transistor or the n-type metal-oxide-semiconductor transistor.

28. The method of claim 1, wherein the first group of one or more semiconductor structures and the second group of the plurality of semiconductor structures are formed concurrently.

29. The method of claim 1, wherein a first semiconductor structure of the first group of one or more semiconductor structures is larger than a second semiconductor structure of the second group of the plurality of semiconductor structures.

30. The method of claim 1, including:
etching the entire subset of the second group of the plurality of semiconductor structures that is exposed from the one or more protective layers.

* * * * *